(12) United States Patent
Azevedo et al.

(10) Patent No.: US 10,018,146 B2
(45) Date of Patent: Jul. 10, 2018

(54) PISTON WITH ADVANCED CATALYTIC ENERGY RELEASE

(71) Applicant: FEDERAL-MOGUL LLC, Southfield, MI (US)

(72) Inventors: Miguel Azevedo, Ann Arbor, MI (US); Warran Boyd Lineton, Chelsea, MI (US)

(73) Assignee: Federal-Mogul LLC, Southfield, MI (US)

(*) Notice: Subject to any disclaimer, the term of this patent is extended or adjusted under 35 U.S.C. 154(b) by 0 days.

(21) Appl. No.: 15/458,495

(22) Filed: Mar. 14, 2017

(65) Prior Publication Data

US 2017/0268457 A1 Sep. 21, 2017

Related U.S. Application Data

(60) Provisional application No. 62/309,055, filed on Mar. 16, 2016.

(51) Int. Cl.
*F02F 3/00* (2006.01)
*F02F 3/02* (2006.01)
(Continued)

(52) U.S. Cl.
CPC .............. *F02F 3/02* (2013.01); *B01J 21/066* (2013.01); *B01J 23/42* (2013.01); *B01J 23/866* (2013.01);
(Continued)

(58) Field of Classification Search
CPC .......... F02F 3/00; F02F 7/0085; F02F 7/0087; F02B 2023/0606; F02B 2023/0612
See application file for complete search history.

(56) References Cited

U.S. PATENT DOCUMENTS

| | | |
|---|---|---|
| 1,820,878 A | 8/1931 | Wyckoff |
| 2,780,602 A | 2/1957 | Berkman |

(Continued)

FOREIGN PATENT DOCUMENTS

| | | |
|---|---|---|
| JP | H09209830 A | 8/1997 |
| JP | 2012122445 A | 6/2012 |

(Continued)

OTHER PUBLICATIONS

International Search Report, dated Jun. 21, 2017 (PCT/US2017/022387).

(Continued)

*Primary Examiner* — Long T Tran
(74) *Attorney, Agent, or Firm* — Robert L. Stearns; Dickinson Wright, PLLC

(57) ABSTRACT

A piston capable of reducing undesirable "knock," reducing hydrocarbon emissions, and providing more complete combustion, is provided. The piston includes a multilayer coating having a thickness of 500 microns or less disposed on an upper combustion surface. The coating includes a bond layer including nickel disposed on the upper combustion surface. A thermal barrier layer including a ceramic composition is disposed on the bond layer. A sealant layer formed of metal is disposed on the thermal barrier layer. A catalytic layer including at least one of platinum, ruthenium, rhodium, palladium, osmium, and iridium is disposed on the sealant layer. The catalytic layer can be disposed on select regions or the entire upper combustion surface to promote combustion through a catalyzed reaction.

20 Claims, 3 Drawing Sheets

(51) Int. Cl.

| | | |
|---|---|---|
| *C23C 4/129* | (2016.01) | |
| *C23C 4/131* | (2016.01) | |
| *C23C 4/134* | (2016.01) | |
| *B01J 21/06* | (2006.01) | |
| *B01J 23/42* | (2006.01) | |
| *B01J 23/86* | (2006.01) | |
| *B01J 35/02* | (2006.01) | |
| *B01J 37/02* | (2006.01) | |
| *C23C 14/16* | (2006.01) | |
| *C23C 14/22* | (2006.01) | |
| *C23C 28/00* | (2006.01) | |
| *C25D 7/00* | (2006.01) | |
| *F02F 3/18* | (2006.01) | |
| *F02F 3/26* | (2006.01) | |
| *F02F 3/12* | (2006.01) | |
| *F02B 23/06* | (2006.01) | |

(52) U.S. Cl.
CPC .......... *B01J 35/02* (2013.01); *B01J 37/0244* (2013.01); *C23C 4/129* (2016.01); *C23C 4/131* (2016.01); *C23C 4/134* (2016.01); *C23C 14/16* (2013.01); *C23C 14/22* (2013.01); *C23C 28/3215* (2013.01); *C23C 28/34* (2013.01); *C25D 7/008* (2013.01); *F02F 3/0092* (2013.01); *F02F 3/12* (2013.01); *F02F 3/18* (2013.01); *F02F 3/26* (2013.01); *F02B 2023/0606* (2013.01); *F02B 2023/0612* (2013.01); *F02F 2003/0007* (2013.01); *F02F 2200/00* (2013.01); *F05C 2251/048* (2013.01)

(56) References Cited

U.S. PATENT DOCUMENTS

| | | | |
|---|---|---|---|
| 2,978,360 A | 4/1961 | Bradstreet et al. | |
| 3,049,874 A | 8/1962 | Morrow et al. | |
| 3,203,321 A | 8/1965 | Rosen | |
| 3,263,310 A | 8/1966 | Rosen | |
| 4,530,340 A | 7/1985 | Totman | |
| 4,538,562 A | 9/1985 | Matsui et al. | |
| 4,577,611 A | 3/1986 | Hagino | |
| 4,646,707 A | 3/1987 | Pfefferle | |
| 4,773,368 A | 9/1988 | Pfefferle | |
| 4,819,595 A | 4/1989 | Pfefferle | |
| 5,169,674 A | 12/1992 | Miller | |
| 5,236,787 A | 8/1993 | Grassi | |
| 6,044,819 A * | 4/2000 | Rivers .............. F02F 1/004 123/193.1 |
| 6,058,918 A * | 5/2000 | Noetzlin .............. F02B 51/02 123/670 |
| 6,148,785 A * | 11/2000 | Rivers .............. F02F 1/004 123/193.1 |
| 6,240,912 B1 | 6/2001 | Stanglmaier et al. | |
| 6,655,369 B2 * | 12/2003 | Gillston .............. F02B 51/02 123/188.3 |
| 7,066,132 B1 | 6/2006 | Verbrugge et al. | |
| 7,263,985 B2 | 9/2007 | Kaneko | |
| 7,527,048 B2 | 5/2009 | Gillston et al. | |
| 8,893,711 B2 * | 11/2014 | Kennedy .............. F24J 2/055 126/651 |
| 8,925,534 B2 | 1/2015 | Bachmann et al. | |
| 8,936,003 B2 | 1/2015 | Cockerill | |
| 2004/0009106 A1 * | 1/2004 | Galligan .............. B01D 53/885 422/180 |
| 2005/0056007 A1 | 3/2005 | Bourgon | |
| 2008/0257200 A1 * | 10/2008 | Minevski .............. C25D 5/50 106/1.18 |
| 2015/0017044 A1 | 1/2015 | Steinwandel et al. | |
| 2015/0204233 A1 | 7/2015 | Nanba et al. | |
| 2016/0273484 A1 | 9/2016 | Tateno et al. | |

FOREIGN PATENT DOCUMENTS

| | | |
|---|---|---|
| JP | 2014173494 A | 9/2014 |
| WO | 198802061 | 3/1988 |
| WO | 199942710 A1 | 8/1999 |
| WO | 2015072227 A1 | 5/2015 |
| WO | 2015072945 A1 | 5/2015 |
| WO | 2015076317 A1 | 5/2015 |

OTHER PUBLICATIONS

Conference Paper: Patrik Soltic and Christian Bach, Conference, "Gas Powered Vehicles" Sep. 30-Jan. 10, 2010, Berlin (EMPA Materials Science & Technology).

* cited by examiner

PISTON WITH ADVANCED CATALYTIC ENERGY RELEASE

CROSS-REFERENCE TO RELATED APPLICATION

This U.S. utility patent application claims priority to U.S. provisional patent application No. 62/309,055, filed Mar. 16, 2016, the contents of which is incorporated herein by reference in its entirety.

BACKGROUND OF THE INVENTION

1. Technical Field

This invention relates generally to pistons for internal combustion engines, and methods of manufacturing the pistons.

2. Related Art

Steel pistons of various designs are used in a diesel combustion system which sharply releases energy from a pre-mixture of fuel-air at the end of an ignition delay period (ID). An impulsive noise signature follows which is objectionable to human hearing and is manifested as a characteristic diesel "knock." In step with this initial energy release, a period, typically milliseconds, of a high in-cylinder temperature occurs, such as 2000-3000° C. The high in-cylinder temperature produces high NOx levels, which engine manufacturers prefer to avoid.

SUMMARY OF THE INVENTION

One aspect of the invention provides a piston comprising an upper crown wall presenting an upper combustion surface. A coating is disposed on the upper combustion surface. The coating includes a thermal barrier layer, a sealant layer, and a catalytic layer. The thermal barrier layer is disposed on the upper combustion surface and includes a ceramic composition. The sealant layer is disposed on the thermal barrier layer and includes metal. The catalytic layer disposed is disposed on the sealant layer, and the catalytic layer includes at least one of platinum, ruthenium, rhodium, palladium, osmium, and iridium.

Another aspect of the invention provides a method of manufacturing a piston. The method includes disposing a coating on an upper combustion surface of an upper crown wall. The coating includes a thermal barrier layer, a sealant layer, and a catalytic layer. The thermal barrier layer is disposed on the upper combustion surface and includes a ceramic composition. The sealant layer is disposed on the thermal barrier layer and includes metal. The catalytic layer disposed is disposed on the sealant layer, and the catalytic layer includes at least one of platinum, ruthenium, rhodium, palladium, osmium, and iridium.

BRIEF DESCRIPTION OF THE DRAWINGS

These and other aspects, features and advantages of the invention will become more readily accompanying drawings, in which.

DETAILED DESCRIPTION OF EXEMPLARY EMBODIMENTS

Figure 1:
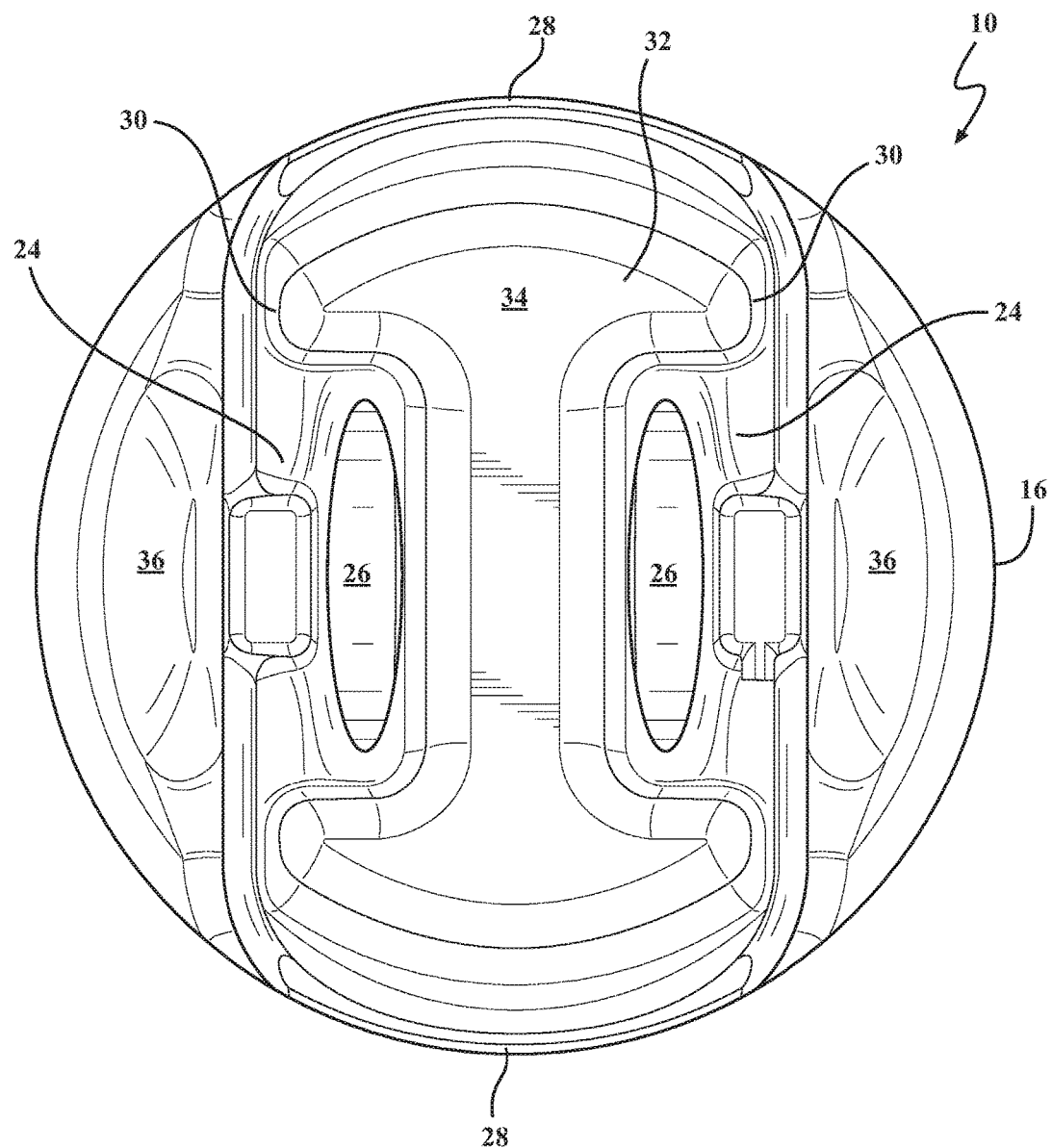
FIG. 1 is a bottom view of a galleryless piston which can include a multilayer coating according to an example embodiment.
Figure 2:
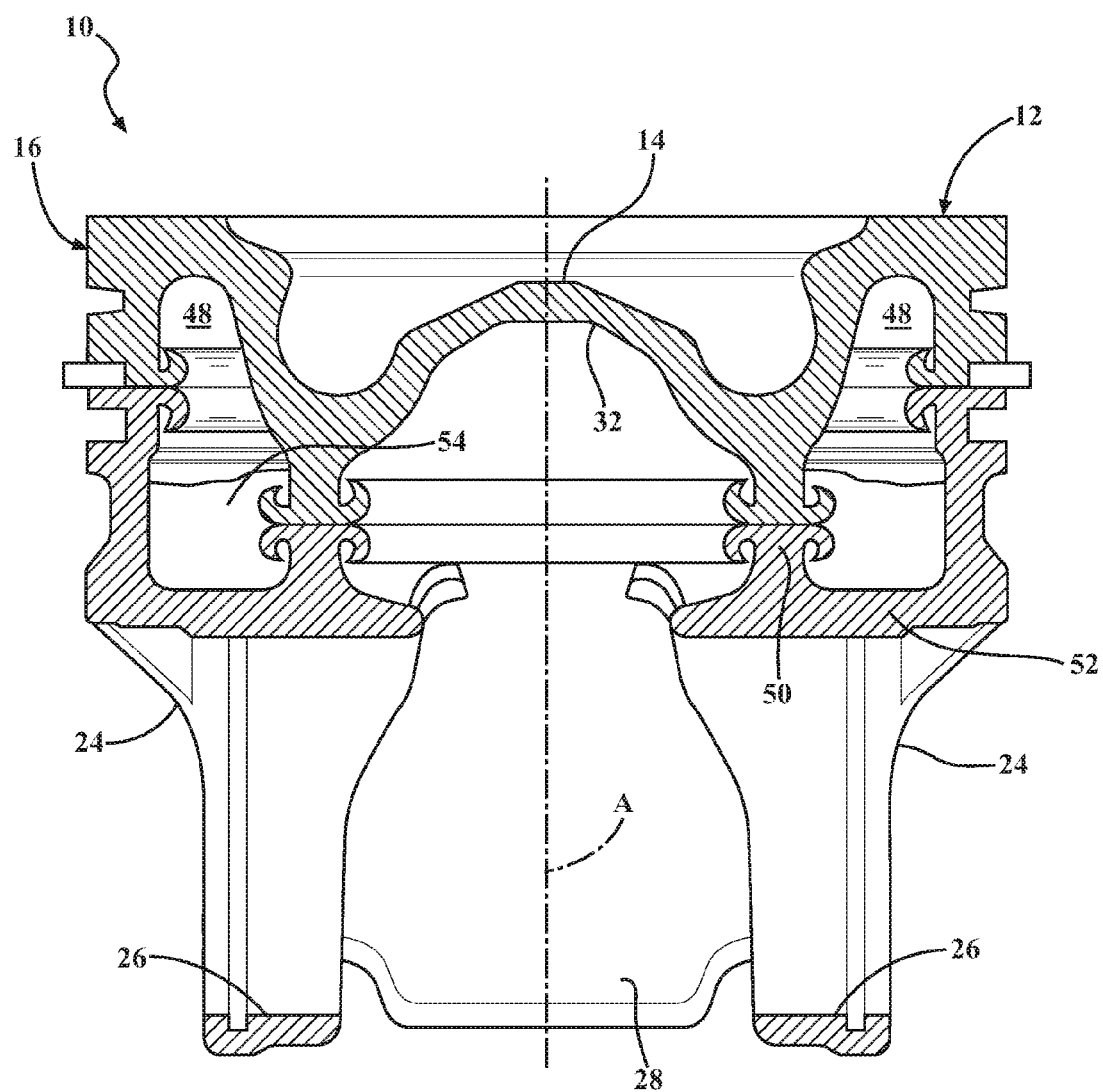
FIG. 2 is a side cross-sectional view of a gallery-cooled piston which can include the multilayer coating according to another example embodiment.
Figure 3:
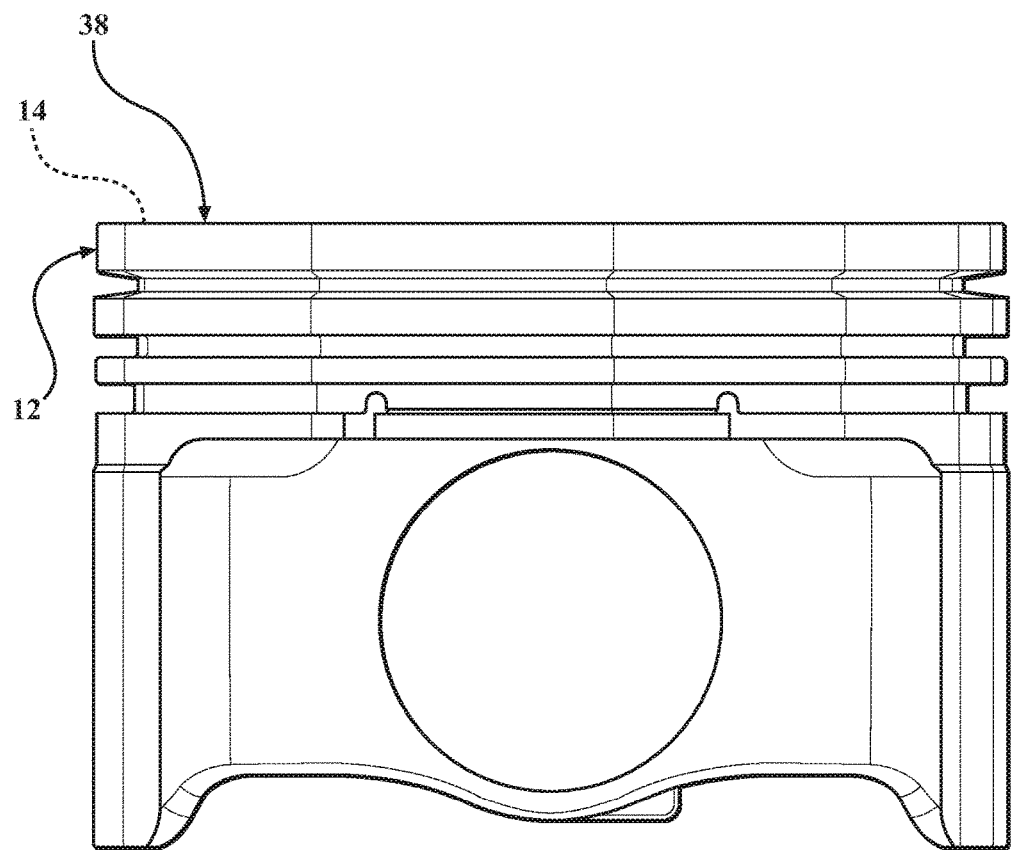
FIG. 3 is a side view of a piston according to another example embodiment, which can be a galleryless or gallery-cooled piston, with the multilayer coating applied.

FIGS. 1-3 illustrate views of a steel piston 10 constructed in accordance with example embodiments of the invention for reciprocating movement in a cylinder bore or chamber (not shown) of an internal combustion engine, such as a modern, compact, high performance vehicle engine, for example. To foster early combustion and thus reduce undesirable diesel "knock," a multilayer coating 38 is applied to the piston 10, which will be discussed further below. The piston 10 to which the multilayer coating 38 is applied can comprise various different designs. For example, the piston 10 can be a galleryless piston, as shown in FIG. 1, or could include a sealed cooling gallery, as shown in FIG. 2. Alternatively, the piston 10 could include an open cooling gallery allowing cooling oil from an oil jet to enter the gallery.

The piston 10 according to the example embodiment of FIG. 1 is galleryless and thus has a reduced weight and operates at a reduced temperature, which contributes to improved thermal efficiency, fuel consumption, and performance of the engine. According to this embodiment, the piston 10 has a monolithic body formed from a single piece of metal material, such as steel. The monolithic body can be formed by machining, forging or casting, with possible finish machining performed thereafter, if desired, to complete construction. The piston 10 of FIG. 1 does not have a plurality of parts joined together, such as upper and lower parts joined to one another, which is commonplace with pistons having enclosed or partially enclosed cooling galleries bounded or partially bounded by a cooling gallery floor. To the contrary, the piston 10 is galleryless in that it does not have a cooling gallery floor or other features bounding or partially bounding a cooling gallery. A bottom view of the galleryless piston 10 is shown in FIG. 1.

The body portion, being made of steel or another metal, is strong and durable to meet the high performance demands, i.e. increased temperature and compression loads, of modern day high performance internal combustion engines. The steel material used to construct the body can be an alloy such as the SAE 4140 grade or different, depending on the requirements of the piston 10 in the particular engine application. Due to the piston 10 being galleryless, the weight and compression height of the piston 10 is minimized, thereby allowing an engine in which the piston 10 is deployed to achieve a reduced weight and to be made more compact. Further yet, even though the piston 10 is galleryless, the piston 10 can be sufficiently cooled during use to withstand the most severe operating temperatures.

The body portion of the piston 10 has an upper head or top section providing an upper crown wall 12. An example of the upper crown wall 12 is shown in FIG. 3. The upper crown wall 12 includes an upper combustion surface 14 that is directly exposed to combustion gasses within the cylinder bore of the internal combustion engine. In the example embodiment of FIG. 1, the upper combustion surface 14 forms a combustion bowl, or a non-planar, concave, or undulating surface around a center axis A. The upper crown wall 12 also includes an undercrown surface 32 facing opposite the upper combustion surface 14. A ring belt 16 depends from the upper crown wall 12 and extends circumferentially along an outer diameter of the piston 10. The ring belt 16 includes a plurality of lands separated from one another by ring grooves.

The piston 10 typically includes a pair of pin bosses 24 depending generally from the undercrown surface 32, inwardly of the ring belt 16. The pin bosses 24 define a pair of laterally spaced pin bores 26 which are vertically spaced from the undercrown surface 32. The piston 10 also includes a pair of skirt panels 28 depending from the ring belt 16 and located diametrically opposite one another. The skirt panels 28 are coupled to the pin bosses 24 by struts 30.

The undercrown surface 32 of the piston 10 of FIG. 1 is formed on an underside of the upper wall 12, directly opposite the upper combustion surface 14 and radially inwardly of the ring belt 16. The undercrown surface 32 is preferably located at a minimum distance from the combustion bowl and is substantially the surface on the direct opposite side from the combustion bowl. The undercrown surface 32 is defined here to be the surface that is visible, excluding any pin bores 26 when observing the piston 10 straight on from the bottom. The undercrown surface 32 is generally form fitting to the combustion bowl of the upper combustion surface 14. In the example embodiment of FIG. 1, the undercrown surface 32 is openly exposed, as viewed from an underside of the piston 10, and it is not bounded by an enclosed or partially enclosed cooling gallery, or any other features tending to retain oil or a cooling fluid near the undercrown surface 32.

The undercrown surface 32 of the piston 10 of FIG. 1 has greater a total surface area (3-dimensional area following the contour of the surface) and a greater projected surface area (2-dimensional area, planar, as seen in plan view) than comparative pistons having a closed or partially closed cooling gallery. This open region along the underside of the piston 10 provides direct access to oil splashing or being sprayed from within the crankcase directly onto the undercrown surface 32, thereby allowing the entire undercrown surface 32 to be splashed directly by oil from within the crankcase, while also allowing the oil to freely splash about the wrist pin (not shown), and further, significantly reduce the weight of the piston 10. Accordingly, although not having a typical closed or partially closed cooling gallery, the generally open configuration of the galleryless piston 10 allows optimal cooling of the undercrown surface 32 and lubrication to the wrist pin joint within the pin bores 26, while at the same time reducing oil residence time on the surfaces near the combustion bowl, which is the time in which a volume of oil remains on the surface.

The undercrown surface 32 of the example galleryless piston 10 is provided by several regions of the piston 10 including an inner undercrown region 34 and outer pockets 36 which are shown in FIG. 1. A first portion of the undercrown surface 32 located at the center axis A is provided by the inner undercrown region 34. The inner undercrown region 34 is surrounded by the pin bosses 24, skirt panels 28, and struts 30. The 2-dimensional and 3-dimensional surface area of the undercrown surface 32 provided by the inner undercrown region 34 is typically maximized so that cooling caused by oil splashing or being sprayed upwardly from the crankcase against the exposed surface can be enhanced, thereby lending to exceptional cooling of the piston 10. A second region of the undercrown surface 32 is provided by the outer pockets 36 which are located outwardly of the pin bosses 24. Each outer pocket 36 is surrounded by one of the pin bosses 24, portions of the struts 30, and a portion of the ring belt 16.

The piston 10 according to the example embodiment of FIG. 2 is a gallery-cooled piston and thus has a sealed outer cooling gallery 48 beneath the undercrown surface 32 and extending circumferential along the ring belt 16. Alternatively, the cooling gallery 48 could be open and thus include an opening (not shown) allowing cooling oil from a jet to spray the undercrown surface 32.

The piston of FIG. 2 also comprises a body formed of a metal material, such as steel, extending circumferentially around a center axis A and longitudinally along the center axis A. The piston 10 includes the upper crown wall 12 presenting the upper combustion surface 14 exposed to a combustion chamber during use in the internal combustion engine, and the undercrown surface 32 facing opposite the combustion surface 14. The piston 10 also includes the ring belt 16, pair of pin bosses 24, and pair of skirt panels 28.

Unlike the piston of FIG. 1, the piston 10 of FIG. 2 includes an inner wall 50 and lower wall 52 to define the sealed cooling gallery 48. The sealed cooling gallery 48 of the piston is typically formed by joining a top part to a bottom part, for example by welding. The top part includes a top portion of the ring belt 16 and an upper portion of an inner wall 50, and the bottom part includes a bottom portion of the ring belt 16 and a lower portion of the inner wall 50, as well as the lower wall 52. As shown in FIG. 2, the sealed cooling gallery is formed by the upper crown wall 12, the portions of the ring belt 16, the inner wall 50, and the lower inner 52.

In the example embodiment of FIG. 2, the sealed outer cooling gallery 48 contains a cooling medium 54 to manage heat loss from the combustion chamber through the piston 10, and thus improve engine brake thermal efficiency (BTE). The cooling medium could be comprised of a solid powder or mixture of solid powders, a liquid or mixture of more than one liquid, a gas or mixture of gases or a combination of solid, liquid and gas phases. As an alternative to filling the outer cooling gallery 48 with a coolant composition, the outer cooling gallery 48 could be left unfilled.

Figure 3A:
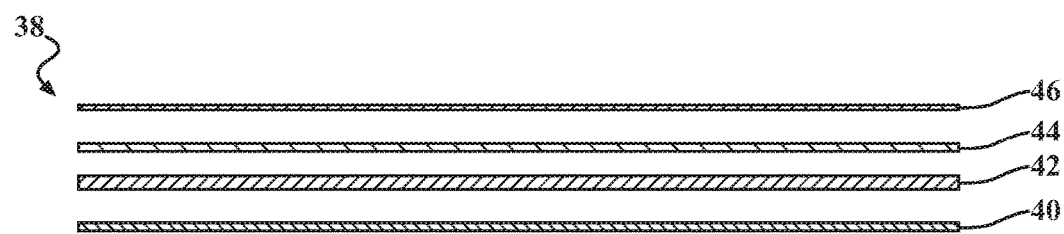
FIG. 3A is an exploded view of the multilayer coating according to an example embodiment.

To reduce heat flow to the upper crown wall 12, foster early combustion, and thus reduce undesirable diesel "knock," a multilayer coating 38 is applied to the upper combustion surface 14 of the piston 10 and confers thermal insulation to the upper crown wall 12. The coating 38 includes a bond layer 40 applied to the upper combustion surface 14, a thermal barrier layer 42 disposed on the bond layer 40 and connected to the upper combustion surface 14 by the bond layer 40, a sealant layer 44 disposed on the thermal barrier layer 42, and a catalytic layer 46 disposed or deposited on the sealant layer 44. FIG. 3A illustrates an exploded view of the multilayer coating 38 according to the example embodiment. As stated above, the multilayer coating 38 can be applied to the piston having the design of FIG. 1, FIG. 2, or to a steel piston having another design.

As shown in FIG. 3A, the multilayer coating 38 includes the bond layer 40 disposed directly on the steel upper combustion surface 14 and anchoring the thermal barrier layer 42 to the upper combustion surface 14 of the upper crown wall 12. The bond layer 40 is includes or consists of metal, and preferably a superalloy. For example, the bond coat 40 can be formed of a nickel-based composition, such as nickel chromium aluminum yttrium (NiCrAlY) and/or cobalt nickel chromium aluminum yttrium (CoNiCrAlY). The bond layer 40 can be provided in the form of a powder and applied to the upper combustion surface 14 by thermal spraying, or another method. The bond layer 40 typically has a thickness of 50 to 150 microns.

The multilayer coating 38 next includes the thermal barrier layer 42 disposed directly on the bond layer 40 and anchored to the steel upper combustion surface 14 by the bond layer 40. The thermal barrier layer 42 includes or consists of a ceramic composition. In the example embodiment, the thermal barrier layer 42 includes some form partially stabilized zirconia, preferably ceria stabilized zirconia (CSZ). The thermal barrier layer 42 is typically applied to a thickness of 150 to 350 microns by thermal spraying.

The sealant layer 44 is disposed directly on the thermal barrier layer 42 and closes the pores inherent to the ceramic formulation and prevents absorption, desorption, and permeation of combustion gases and fuel through the porous ceramic. The composition of the sealant layer 44 includes or consists of metal and is typically similar to or the same as the bond layer 40. According to the example embodiment, the sealant layer 44 is formed of a nickel-based composition, preferably a superalloy such as nickel chromium aluminum yttrium (NiCrAlY) and/or cobalt nickel chromium aluminum yttrium (CoNiCrAlY). The sealant layer 44 can produce some catalytic activity. The sealant layer 44 is preferably applied over the entire upper combustion surface 14 and over an entire uppermost surface of the thermal barrier layer 42 facing the sealant layer 44 to perform its sealing action. The sealant layer 44 is typically applied to a thickness of 50 to 100 microns by thermal spraying. The nickel-based sealant layer 44 can also be deposited by an electroless nickel deposition process. The sealant layer 44 is typically applied to a thickness of 50 to 100 microns by thermal spraying, or to a thickness of 5 to 50 microns by electroless nickel deposition.

The catalytic layer 46 of the multilayer coating 38 is deposited directly on top of the metallic sealant layer 44 and promotes combustion through a catalyzed reaction, or catalysis. The catalytic layer 46 includes or consists of at least one or more of the platinum group metals, including platinum, ruthenium, rhodium, palladium, osmium, and iridium. The at least one platinum group metal is present in an amount of at least 10 weight percent, based on the total weight of the catalytic layer. The catalytic layer 46 is typically applied separately as a very thin layer ranging from 10 to 1000 nm. The catalytic layer 46 can be electrodeposited from a solution or applied by a physical vapor deposition (PVD) process. The catalytic layer 46 can either be disposed over the whole upper combustion surface 14 or in selective regions only, such as in line with fuel plumes, at the periphery of the flame front, or around the combustion bowl edge.

The total thickness of the multilayer coating 38 is preferably approximately 500 microns or less, which allows it to survive thermal and mechanical loads experienced in the engine. The multilayer coating 38 confers thermal insulation and adiabaticity to the upper crown wall 12 of the piston 10 and can foster early combustion by catalytic action, given that the in cylinder environment of a modern diesel engine is characterized by high temperatures, for example 800-900° C. bulk gas average temperature, and high pressure, such as 220-280 bar. The presence of the one or more platinum group metal can lower the activation energy for immediate fuel cracking and combustion. Thus, the ignition delay can be reduced substantially and with it the pre-mixed combustion phase. What remains is the diffusion combustion regime, i.e., with immediate controlled burning of fuel as it enters the combustion environment. This phase can be regulated by the electronic control module on the engine. Therefore, the objectionable combustion noise can be reduced, and the HC emission can be lowered due to no pockets of stagnant mixture. In addition, lower peak temperatures can be achieved which decreases NOx. Other advantages can arise by decreasing heat lost to the cooling system, so that the residual heat becomes available in the exhaust stream for the energy recovery via a bottoming device. Furthermore, given the severe environment inside the combustion chamber and the chemical action of the catalyst layer 46, sprayed fuel can burn immediately, by passing most of the pre-mixed stage in favor of a diffusion type burning. As stated above, diffusion burning is controllable by the present generation of the engine's electronic control unit (ECU).

Another aspect of the invention provides a method of manufacturing the piston 10 with the multilayer coating 38. The method includes applying the multilayer coating 38 to at least a portion of the upper combustion surface 14. The layers 40, 42, 44, 46 of the multi-layer coating 38 can be applied by various different methods. Typically, the bond layer 40, thermal barrier layer 42, and sealant layer 44 of the multi-layer coating 38 are applied separately by a thermal spray technique, such as wire arc spraying, plasma spraying, or high velocity oxygen fuel (HVOF) spraying. However, the sealant layer 44 and/or bond layer 40 could be electroless nickel deposited from appropriate baths. The catalyst layer 46 is typically electrodeposited from solution or applied by a physical vapor deposition (PVD) process.

The piston 10 is capable of reducing an ignition delay period to such an extent that mostly smooth diffusion burning remains and thus undesirable diesel "knock" is reduced. The piston 10 is also capable of reducing hydrocarbon emissions and providing more complete combustion. Other potential advantages include the use of less refined fuels, higher controlled exhaust temperatures for bottoming cycle energy recovery, and less fuel consumption.

Many modifications and variations of the present invention are possible in light of the above teachings and may be practiced otherwise than as specifically described while within the scope of the claims. It is also contemplated that all features of all claims and of all embodiments can be combined with each other, so long as such combinations would not contradict one another.

What is claimed is:

1. A piston, comprising:
   an upper crown wall presenting an upper combustion surface,
   a coating disposed on said upper combustion surface,
   said coating including a thermal barrier layer disposed on said upper combustion surface,
   said thermal barrier layer including a ceramic composition,
   said coating including a sealant layer disposed on said thermal barrier layer,
   said sealant layer including metal,
   said coating including a catalytic layer disposed on said sealant layer, and
   said catalytic layer including at least one of platinum, ruthenium, rhodium, palladium, osmium, and iridium.

2. The piston of claim 1, wherein said catalytic layer includes platinum.

3. The piston of claim 1, wherein said catalytic layer has a thickness of 10 to 1000 nm.

4. The piston of claim 1, wherein said catalytic layer is disposed on regions of said upper combustion surface and on less than an entirety of said upper combustion surface.

5. The piston of claim 1, wherein said ceramic composition of said thermal barrier layer includes partially stabilized zirconia.

6. The piston of claim 1, wherein said sealant layer includes a nickel-based composition.

7. The piston of claim 1, wherein said coating further includes a bond layer disposed between said upper combustion surface and said thermal barrier layer, and said bond layer includes metal.

8. The piston of claim 7, wherein said bond layer includes a nickel-based composition.

9. The piston of claim 1, wherein said coating has a total thickness of 500 microns or less.

10. The piston of claim 1, wherein said coating further includes a bond layer disposed between said upper combustion surface and said thermal barrier layer, said bond layer includes metal, said bond layer has a thickness of 50 to 150 microns, said thermal barrier layer has a thickness of 150 to 350 microns, said sealant layer has a thickness of 50 to 100 microns, and said catalytic layer has a thickness of 10 to 1000 nm.

11. The piston of claim 1, wherein said at least one of platinum, ruthenium, rhodium, palladium, osmium, and iridium is present in an amount of at least 10 weight percent, based on the total weight of the catalytic layer,
said coating further includes a bond layer disposed directly on said upper combustion surface,
said bond layer is disposed between said upper combustion surface and said thermal barrier layer,
said bond layer includes at least one of nickel chromium aluminum yttrium (NiCrAlY) and cobalt nickel chromium aluminum yttrium (CoNiCrAlY),
said bond layer is formed of powder,
said bond layer has a thickness of 50 to 150 microns,
said thermal barrier layer is disposed directly on said bond layer,
said ceramic composition of said thermal barrier layer includes ceria stabilized zirconia (CSZ),
said thermal barrier layer has a thickness of 150 to 350 microns,
said sealant layer is disposed directly on said thermal barrier layer,
said sealant layer is applied over an entire uppermost surface of said thermal barrier layer facing said sealant layer,
said sealant layer includes at least one of nickel chromium aluminum yttrium (NiCrAlY) and cobalt nickel chromium aluminum yttrium (CoNiCrAlY),
said sealant layer has a thickness of 50 to 100 microns,
said catalytic layer is disposed directly said sealant layer,
said catalytic layer has a thickness of 10 to 1000 nm, and
said coating has a total thickness of 500 microns or less.

12. The piston of claim 1, wherein said piston includes a body formed of a single piece of steel,
said body includes said upper crown wall presenting said upper combustion surface,
said upper combustion surface is non-planar surface around a center axis,
said upper crown wall includes an undercrown surface facing opposite said upper combustion surface,
said undercrown surface is exposed from an underside of said piston,
said body includes a ring belt depending from said upper crown wall and extending circumferentially along an outer diameter of said piston,
said ring belt includes a plurality of lands separated from one another by ring grooves,
said body includes a pair of pin bosses depending from said undercrown surface inwardly of said ring belt,
said pin bosses define a pair of laterally spaced pin bores which are vertically spaced from said undercrown surface,
said body includes a pair of skirt panels depending from said ring belt and located diametrically opposite one another,
said skirt panels are connected to said pin bosses by struts,
said undercrown surface includes an inner undercrown region surrounded by said pin bosses and said skirt panels and said struts,
said undercrown surface includes a second region provided by outer pockets located outwardly of said pin bosses,
each one of said outer pockets is surrounded by one of said pin bosses, a portion of said ring belt, and said struts connecting said one pin boss to said skirt panels.

13. The piston of claim 1, wherein said piston includes a body formed of steel,
said body extends circumferentially around a center axis and longitudinally along said center axis,
said body includes said upper wall presenting said upper combustion surface,
said upper combustion surface is non-planar surface around a center axis,
said upper crown wall includes an undercrown surface facing opposite said upper combustion surface,
said undercrown surface is exposed from an underside of said piston,
said body includes a ring belt depending from said upper crown wall and extending circumferentially along an outer diameter of said piston,
said ring belt includes a plurality of lands separated from one another by ring grooves,
said body includes a pair of pin bosses depending from said undercrown surface inwardly of said ring belt,
said pin bosses define a pair of laterally spaced pin bores which are vertically spaced from said undercrown surface,
said body includes a pair of skirt panels depending from said ring belt and located diametrically opposite one another,
said skirt panels are connected to said pin bosses by struts,
said body includes a top part joined to a bottom part presenting a cooling gallery therebetween,
said top part includes a top portion of said ring belt and an upper portion of an inner wall,
said bottom part includes a bottom portion of said ring belt and a lower portion of said inner wall and a lower wall,
said upper crown wall and said portions of said ring belt and said inner wall and said lower wall present said cooling gallery.

14. The piston of claim 1, wherein said cooling gallery contains a cooling medium, and said cooling medium includes at least one solid powder and/or at least one liquid.

15. A method of manufacturing a piston, comprising the steps of:
disposing a coating on an upper combustion surface of an upper crown wall,
the coating including a thermal barrier layer disposed on the upper combustion surface,
the thermal barrier layer including a ceramic composition,
the coating including a sealant layer disposed on the thermal barrier layer,
the sealant layer including metal, the coating including a catalytic layer disposed on the sealant layer, and the catalytic layer including at least one of platinum, ruthenium, rhodium, palladium, osmium, and iridium.

16. The method of claim 15, wherein the step of disposing the coating on the upper combustion surface includes applying the catalyst layer by electrodeposition or physical vapor deposition (PVD).

17. The method of claim 15, wherein the step of disposing the coating on the upper combustion surface includes applying at least one of the thermal barrier layer and the sealant layer by thermal spraying.

18. The method of claim 17, wherein the thermal spraying includes at least one of wire arc spraying, plasma spraying, and high velocity oxygen fuel (HVOF) spraying.

19. The method of claim 15, wherein the step of disposing the coating on the upper combustion surface includes applying a bond layer between the upper combustion surface and the thermal barrier layer.

20. The method of claim 19, wherein the step of applying the bond layer includes thermal spraying.

* * * * *